United States Patent
Inazu et al.

(10) Patent No.: US 11,404,606 B2
(45) Date of Patent: Aug. 2, 2022

(54) SEMICONDUCTOR LIGHT-EMITTING ELEMENT

(71) Applicant: NIKKISO CO., LTD., Tokyo (JP)

(72) Inventors: Tetsuhiko Inazu, Hakusan (JP); Noritaka Niwa, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 44 days.

(21) Appl. No.: 16/895,343

(22) Filed: Jun. 8, 2020

(65) Prior Publication Data

US 2020/0395506 A1 Dec. 17, 2020

(30) Foreign Application Priority Data

Jun. 11, 2019 (JP) .............................. JP2019-108417
Oct. 16, 2019 (JP) .............................. JP2019-189327

(51) Int. Cl.
*H01L 33/32* (2010.01)
*H01L 33/42* (2010.01)
*H01L 33/40* (2010.01)

(52) U.S. Cl.
CPC ............ *H01L 33/32* (2013.01); *H01L 33/405* (2013.01); *H01L 33/42* (2013.01)

(58) Field of Classification Search
CPC .............................. H01L 33/32; H01L 33/405
See application file for complete search history.

(56) References Cited

U.S. PATENT DOCUMENTS

2018/0083164 A1* 3/2018 Takenaka ................ H01L 33/38

FOREIGN PATENT DOCUMENTS

| JP | 2006-041133 A | 2/2006 |
| JP | 2007027540 A | 2/2007 |
| JP | 2007-103690 A | 4/2007 |
| JP | 2007103689 A | 4/2007 |
| JP | 2015-216352 A | 12/2015 |
| JP | 2018049958 A | 3/2018 |

(Continued)

OTHER PUBLICATIONS

Takayoshi Takano et al, "Deep-ultraviolet light-emitting diodes with external quantum efficiency higher than 20% at 275 nm achieved by improving light-extraction efficiency," 2017 Appl. Phys. Express 10 031002 (Year: 2017).*

(Continued)

*Primary Examiner* — Mark W Tornow
(74) *Attorney, Agent, or Firm* — Muncy, Geissler, Olds & Lowe, P.C.

(57) ABSTRACT

A semiconductor light-emitting element is configured to emit ultraviolet light having a wavelength of 320 nm or shorter. Denoting a total area of a principal surface of a substrate as S0, an area on a p-type semiconductor layer in which a p-side contact electrode is formed as S1, an area on an n-type semiconductor layer in which an n-side contact electrode is formed as S2, a reflectivity of the p-side contact electrode for ultraviolet having a wavelength of 280 nm incident from a side of the p-type semiconductor layer as R1, and a reflectivity of the n-side contact electrode for ultraviolet light having a wavelength of 280 nm incident from a side of the n-type semiconductor layer as R2, $(S1/S0) \times R1 + (S2/S0) \times R2 \geq 0.5$, $S1 > S2$, and $R1 \leq R2$.

8 Claims, 5 Drawing Sheets

(56) References Cited

FOREIGN PATENT DOCUMENTS

WO    WO-2012/127660 A1    9/2012

OTHER PUBLICATIONS

Chang-Hoon Choi, Jaecheon Han, Jae-Seong Park, and Tae-Yeon Seong, "Near ultraviolet InGaN/AlGaN-based light-emitting diodes with highly reflective tin-doped indium oxide/Al-based reflectors," Opt. Express 21, 26774-26779 (2013) (Year: 2013).*
Noritoshi Maeda, Hideki Hirayama, "Realization of high-efficiency deep-UV LEDs using transparent p-AlGaN contact layer," vol. 10, Issue 11, Special Issue: 40th International Symposium on Compound Semiconductors (ISCS 2013), Nov. 2013, pp. 1521-1524. (Year: 2013).*
Noritoshi Maeda, Joosun Yun, Masafumi Jo, and Hideki Hirayama, "Enhancing the light-extraction efficiency of AlGaN deep-ultraviolet light-emitting diodes using highly reflective Ni/Mg and Rh as p-type electrodes," 2018 Jpn. J. Appl. Phys. 57 04FH08 (Year: 2018).*
Office Action of JP Application No. 2019-189327 and English translation, dated Feb. 12, 2020, 9 pages.
Office Action and Search Report (with English Translation) corresponding to Taiwanese application No. 109119119 dated Apr. 14, 2021. (pp. 11).
Office Action issued in corresponding JP application No. 2019-189327 dated Jun. 18, 2020 (with English translation).

\* cited by examiner

SEMICONDUCTOR LIGHT-EMITTING ELEMENT

RELATED APPLICATION

Priority is claimed to Japanese Patent Application No. 2019-108417, filed on Jun. 11, 2019, and Japanese patent Application No. 2019-189327, filed on Oct. 16, 2019, the entire contents of which are incorporated herein by reference.

BACKGROUND OF THE INVENTION

1. Field of the Invention

The present invention relates to semiconductor light-emitting elements.

2. Description of the Related Art

A light-emitting element for emitting deep ultraviolet light having a wavelength of 355 nm or smaller includes an AlGaN-based n-type clad layer, an active layer, and a p-type clad layer stacked on a substrate. An p-side electrode of Ni/Au is provided on the p-type clad layer for obtaining ohmic contact. The p-side electrode of Ni/Au has a low reflectivity for deep ultraviolet light. Therefore, much of the deep ultraviolet light traveling from the active layer toward the p-side electrode is absorbed by the p-side electrode, resulting in lower light extraction efficiency. This is addressed by providing an opening on the p-type clad layer in which the p-side electrode is not formed and forming an Al reflection electrode having a high reflectivity for deep ultraviolet light in the opening.

When an opening is formed for the reflection electrode, the contact area of the p-side electrode is lowered, resulting in an increase in the contact resistance of the p-side electrode. In a semiconductor light-emitting element for emitting deep ultraviolet light, it is preferred to realize an electrode structure having a low resistance and a high reflectivity.

SUMMARY OF THE INVENTION

The present invention addresses the above-described issue, and an illustrative purpose thereof is to improve the light extraction efficiency of a semiconductor light-emitting element.

A semiconductor light-emitting element according to an embodiment of the present invention includes: a n-type semiconductor layer of an n-type AlGaN-based semiconductor material provided on a principal surface of a substrate; an active layer of an AlGaN-based semiconductor material provided on the n-type semiconductor layer and configured to emit ultraviolet light having a wavelength of 320 nm or shorter; a p-type semiconductor layer provided on the active layer; a p-side contact electrode provided on the p-type semiconductor layer; and an n-side contact electrode provided in a region on the n-type semiconductor layer different from a region in which the active layer is formed. Denoting a total area of the principal surface of the substrate as S0, an area on the p-type semiconductor layer in which the p-side contact electrode is formed as S1, an area on the n-type semiconductor layer in which the n-side contact electrode is formed as S2, a reflectivity of the p-side contact electrode for ultraviolet having a wavelength of 280 nm incident from a side of the p-type semiconductor layer as R1, and a reflectivity of the n-side contact electrode for ultraviolet light having a wavelength of 280 nm incident from a side of the n-type semiconductor layer as R2, $(S1/S0) \times R1 + (S2/S0) \times R2 \geq 0.5$, $S1 > S2$, and $R1 \leq R2$.

According to this embodiment, the area occupied by the active layer for improvement of light emission efficiency can be enlarged so that the light emission efficiency of the active layer can be improved, by configuring the area S1 in which the p-side contact electrode is formed to be larger than the area S2 in which the n-side contact electrode is formed. Meanwhile, it is not easy to increase the reflectivity R1 of the p-side contact electrode formed in a large area. The reflectivity R1 is constrained to be equal to lower than the reflectivity R2 of the n-side contact electrode formed in a small area. Under these conditions, the embodiment realizes a reflectivity of 50% or higher relative to the total area S0 of the substrate both in the n-side contact electrode and in the p-side contact electrode, reduces the loss incurred by absorption in the n-side or p-side contact electrode, and increases the light extraction efficiency of the element as a whole.

The p-side contact electrode may include an Rh layer in contact with the p-type semiconductor layer.

The p-side contact electrode may include a transparent conductive oxide layer in contact with the p-type semiconductor layer and a metal layer provided on the transparent conductive oxide layer. Denoting a transmissivity of the transparent conductive oxide layer for ultraviolet having a wavelength of 280 nm incident from a side of the p-type semiconductor layer as T, a reflectivity of the metal layer for ultraviolet having a wavelength of 280 nm incident from a side of the transparent conductive oxide layer as R, the reflectivity R1 of the p-side contact electrode may be such that $R1 = RT^2$.

The transparent conductive oxide layer may be an indium tin oxide layer having a thickness of 4 nm or smaller. The metal layer includes an Al layer having a thickness of 100 nm or larger.

The n-side contact electrode may include a Ti layer in contact with the n-type semiconductor layer and having a thickness of not smaller than 1 nm and not larger than 2 nm and an Al layer provided on the Ti layer and having a thickness of 100 nm or larger.

The semiconductor light-emitting element may be configured such that $(S1+S2)/S0 \geq 0.7$, $R1 \geq 0.6$, and $R2 \geq 0.8$.

The p-type semiconductor layer may include a p-type contact layer in contact with the p-side contact electrode, and the p-type contact layer may be a p-type AlGaN or p-type GaN layer having an AlN ratio of 20% or lower, and a contact resistance between the p-type contact layer and the p-side contact electrode may be $1 \times 10^{-2} \Omega \cdot cm^2$ or smaller.

A thickness of the p-type contact layer may be 20 nm or smaller.

DETAILED DESCRIPTION OF THE INVENTION

Figure 1:
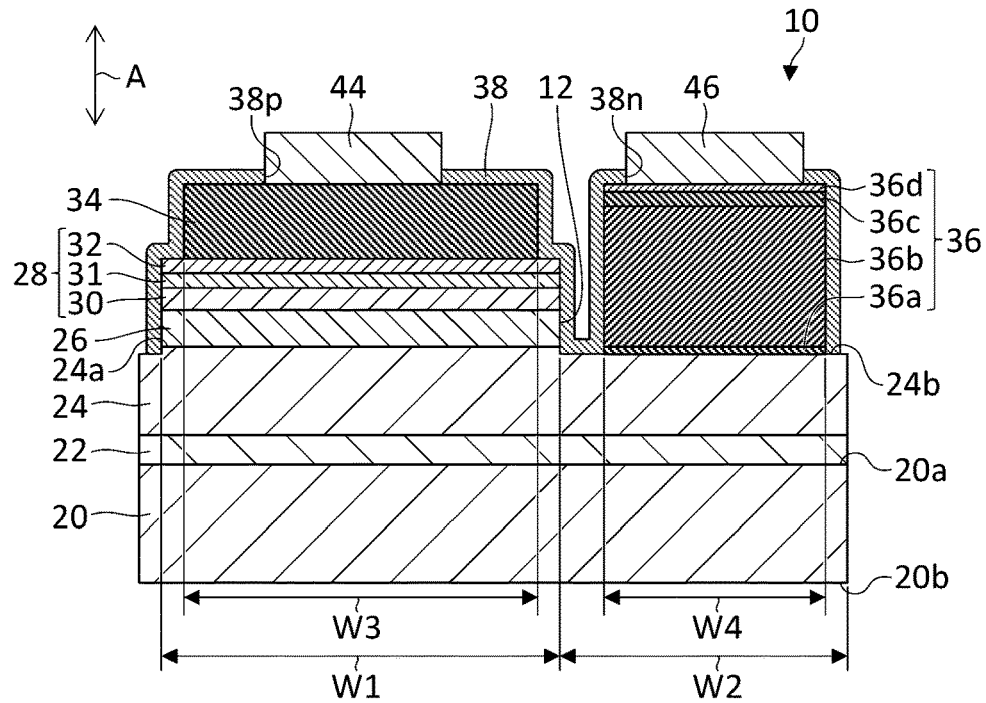
FIG. 1 is a cross sectional view schematically showing a configuration of a semiconductor light-emitting element according to an embodiment.

The invention will now be described by reference to the preferred embodiments. This does not intend to limit the scope of the present invention, but to exemplify the invention.

A detailed description will be given of embodiments of the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light-emitting element.

The embodiment relates to a semiconductor light-emitting element configured to emit "deep ultraviolet light" having a central wavelength λ of about 360 nm or shorter, which is a so-called deep ultraviolet-light emitting diode (DUV-LED). To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength λ of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" mainly include GaN or InGaN. Similarly, those materials that do not contain GaN may be distinguished by referring to them as "AlN-based semiconductor materials". "AlN-based semiconductor materials" include AlN or InAlN.

FIG. 1 is a cross sectional view schematically showing a configuration of a semiconductor light-emitting element 10 according to an embodiment. The semiconductor light-emitting element 10 includes a substrate 20, a base layer 22, an n-type semiconductor layer 24, an active layer 26, a p-type semiconductor layer 28, a p-side contact electrode 34, an n-side contact electrode 36, a protective layer 38, a p-side pad electrode 44, and an n-side pad electrode 46.

Referring to FIG. 1, the direction indicated by the arrow A may be referred to as "vertical direction" or "thickness direction". Further, the direction away from the substrate 20 may be defined as "upward", and the direction toward the substrate 20 may be defined as "downward".

The substrate 20 is a substrate having translucency for the deep ultraviolet light emitted by the semiconductor light-emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the layers from the base layer 22 through the p-type semiconductor layer 28. The second principal surface 20b is a principal surface that is a light extraction substrate for extracting the deep ultraviolet light emitted by the active layer 26 outside. In a variation, the substrate 20 may be an AlN substrate or an AlGaN substrate.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN (HT-AlN; High Temperature-AlN) layer gown at a high temperature. The base layer 22 may include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer and an undoped AlGaN layer.

The base layer 22 is formed such that the concentration of silicon (Si) as an n-type impurity is $5\times10^{17}$ $cm^{-3}$ or lower and is configured not to contribute to conduction when electrons are injected from the n-side contact electrode 36 to the active layer 26. In other words, the base layer 22 has a lower n-type impurity concentration than the n-type semiconductor layer 24 and so has a lower conductivity (i.e., a higher resistivity).

The n-type semiconductor layer 24 is provided on the base layer 22. The n-type semiconductor layer 24 is an n-type AlGaN-based semiconductor material layer. For example, the n-type semiconductor layer 24 is an AlGaN layer doped with silicon (Si) as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is 25% or higher, and, preferably, 40% or higher, or 50% or higher. The n-type semiconductor layer 24 has a band gap larger than the wavelength of the deep ultraviolet light emitted by the active layer 26. For example, the n-type semiconductor layer 24 is formed to have a band gap of 4.3 eV or larger. It is preferable to form the n-type semiconductor layer 24 such that the molar fraction of AlN is 80% or lower, i.e., the band gap is 5.5 eV or smaller. It is more preferable to form the n-type semiconductor layer 24 such that the molar fraction of AlN is 70% or lower (i.e., the band gap is 5.2 eV or smaller). The n-type semiconductor layer 24 has a thickness of about 1 μm-3 μm. For example, the n-type semiconductor layer 24 has a thickness of about 2 μm.

The n-type semiconductor layer 24 is formed such that the concentration of Si as the impurity is not lower than $1\times10^{18}/cm^3$ and not higher than $5\times10^{19}/cm^3$. It is preferred that to form the n-type semiconductor layer 24 such that the Si concentration is not lower than $5\times10^{18}/cm^3$ and not higher than $3\times10^{19}/cm^3$, and it is preferred to form it such that the Si concentration is not lower than $7\times10^{18}/cm^3$ and not higher than $2\times10^{19}/cm^3$. In one example, the Si concentration in the n-type semiconductor layer 24 is around $1\times10^{19}/cm^3$ and is in a range not lower than $8\times10^{18}/cm^3$ and not higher than $1.5\times10^{19}/cm^3$.

The n-type semiconductor layer 24 includes a first top surface 24a and a second top surface 24b. The first top surface 24a is where the active layer 26 is formed, and the second top surface 24b is where the active layer 26 is formed. The first top surface 24a and the second top surface 24b have different heights, and the height from the substrate 20 to the first top surface 24a is larger than the height from the substrate 20 to the second top surface 24b. The region where the first top surface 24a is located is defined as "first region W1", and the region where the second top surface 24b is located is defined as "second region W2". The second region W2 is adjacent to the first region W1.

The active layer 26 is provided on the first top surface 24a of the n-type semiconductor layer 24. The active layer 26 is made of an AlGaN-based semiconductor material and forms a double heterojunction structure by being sandwiched by the n-type semiconductor layer 24 and the p-type semiconductor layer 28. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 320 nm or shorter.

The active layer 26 may have, for example, a monolayer or multilayer quantum well structure. The active layer 26 is comprised of a stack of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the well layer and the barrier layer may be additionally provided between the first barrier layer and the first well layer. The barrier layer and the well layer have a thickness of about 1 nm-20 nm, and has a thickness of, for example, about 2 nm-10 nm.

The active layer 26 may further include an electron blocking layer directly in contact with the p-type semiconductor layer 28. The electron blocking layer is an undoped AlGaN-based semiconductor material layer and is formed such that, for example, the molar fraction of AlN is 40% or higher, and, preferably, 50% or higher. The electron blocking layer may be formed such that the molar fraction of AlN is 80% or higher or may be made of an AlN-based semiconductor material that does not substantially contain GaN. The electron blocking layer has a thickness of about 1 nm-10 nm. For example, the electron blocking layer has a thickness of about 2 nm-5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 includes a p-type first clad layer 30, a p-type second clad layer 31, and a p-type contact layer 32. The p-type first clad layer 30, the p-type second clad layer 31, and the p-type contact layer 32 are formed such that their AlN ratios (proportions of AlN) differ each other.

The p-type first clad layer 30 is a p-type AlGaN layer having a relatively high AlN ratio, and the composition ratio thereof is selected to transmit the deep ultraviolet light emitted by the active layer 26. The p-type first clad layer 30 is formed such that the molar fraction of AlN is 40% or higher, and, preferably, 50% or higher, or 60% or higher. The AlN ratio of the p-type first clad layer 30 is, for example, similar to the AlN ratio of the n-type semiconductor layer 24 or larger than the AlN ratio of the n-type semiconductor layer 24. The AlN ratio of the p-type first clad layer 30 may be 70% or higher, or 80% or higher. The p-type first clad layer 30 has a thickness of about 10 nm-100 nm and has a thickness of, for example, about 15 nm-70 nm.

The p-type second clad layer 31 is a p-type AlGaN layer having a medium AlN ratio and has an AlN ratio lower than that of the p-type first clad layer 30 and higher than that of the p-type contact layer 32. The p-type second clad layer 31 is formed such that the molar fraction of AlN is 25% or higher, and, preferably, 40% or higher, or 50% or higher. The AlN ratio of the p-type second clad layer 31 is configured to be, for example, about ±10% of the AlN ratio of the n-type semiconductor layer 24. The second clad layer 31 has a thickness of about 5 nm-250 nm and has a thickness of about 10 nm-150 nm. The p-type second clad layer 31 may not be provided.

The p-type contact layer 32 is a p-type AlGaN layer or a p-type GaN layer having a relatively low AlN ratio. The p-type contact layer 32 is formed such that the AlN ratio is 20% or lower in order to obtain proper ohmic contact with the p-side contact electrode 34. Preferably, the p-type contact layer 32 is formed such that the AlN ratio is 10% or lower, 5% or lower, or 0%. In other words, the p-type contact layer 32 may be made of a p-type GaN-based semiconductor material that does not substantially contain AlN. As a result, the p-type contact layer 32 could absorb the deep ultraviolet light emitted by the active layer 26. It is preferred to form the p-type contact layer 32 to be thin to reduce the quantity of absorption of the deep ultraviolet light emitted by the active layer 26. The p-type contact layer 32 has a thickness of about 5 nm-30 nm and has a thickness of about 10 nm-20 nm.

The p-side contact electrode 34 is provided on the p-type semiconductor layer 28. The p-side contact electrode 34 can be in ohmic contact with the p-type semiconductor layer 28 (i.e., the p-type contact layer 32) and is made of a material having a high reflectivity for the deep ultraviolet light emitted by the active layer 26. The material having such a property is limited. Our knowledge shows that rhodium (Rh) can be used. By configuring the p-side contact electrode 34 as an Rh layer, the contact resistance relative to the p-type contact layer 32 can be $1\times10^{-2}$ Ω·cm² or smaller (e.g., $1\times10^{-4}$ Ω·cm² or smaller), and the reflectivity of 60% or higher (e.g., about 60%-65%) for ultraviolet light having a wavelength of 280 nm can be obtained. In this case, it is preferred that the thickness of the Rh layer forming the p-side contact electrode 34 be 50 nm or larger or 100 nm or larger. In this specification, the reflectivity of the p-side contact electrode 34 for deep ultraviolet light having a wavelength of 280 nm incident from the side of the p-type semiconductor layer 28 is also referred to as "first reflectivity R1".

The p-side contact electrode 34 is formed inside the first region W1. The region in which the p-side contact electrode 34 is formed is defined as "third region W3". The p-side contact electrode 34 is formed to be in ohmic contact with the p-type semiconductor layer 28 over the entirety of the third region W3 and to have a high reflectivity for deep ultraviolet light over the entirety of the third region W3. It is preferred that the p-side contact electrode 34 be formed to have a uniform thickness over the entirety of the third region W3. This allows the p-side contact electrode 34 to function as a highly efficient reflection electrode that reflects the deep ultraviolet light from the active layer 26 and guides it toward the second principal surface 20b of the substrate 20 and to function as a low-resistance contact electrode over the entirety of the third region W3.

The n-side contact electrode 36 is provided on the second top surface 24b of the n-type semiconductor layer 24. The n-side contact electrode 36 is provided in the second region W2 different from the first region W1 in which the active layer 26 is provided. The n-side contact electrode 36 is made of a material that can be in ohmic contact with the n-type semiconductor layer 24 and has a high reflectivity for the deep ultraviolet light emitted by the active layer 26. The n-side contact electrode 36 includes a first titanium (Ti) layer 36a directly in contact with the n-type semiconductor layer 24, an aluminum (Al) layer 36b directly in contact with the first Ti layer 36a, a second Ti layer 36c provided on the Al layer 36b, and a titanium nitride (TiN) layer 36d provided on the second Ti layer 36c.

The thickness of the first Ti layer 36a is about 1 nm-10 nm and is preferably 5 nm or smaller, and, more preferably, 1 nm-2 nm. By configuring the first Ti layer 36a to have a small thickness, the ultraviolet reflectivity of the n-side contact electrode 32 as viewed from the n-type semiconductor layer 24 can be increased. The thickness of the Al layer 36b is about 100 nm-1000 nm and is preferably 200 nm or larger. By configuring the Al layer to have a large thickness, the ultraviolet reflectivity of the n-side contact electrode 36 can be increased.

The second Ti layer 36c and the TiN layer 36d are provided to cover the surface of the Al layer 36b and prevent the Al layer 36b from being oxidized when the n-side contact electrode 36 is annealed. The total thickness of the second Ti layer 36c and the TiN layer 36d is preferably 20 nm or larger, and, more preferably, 30 nm or larger. By way of one example, the thickness of the second Ti layer 36c is about 10 nm-50 nm, and the thickness of the TiN layer 36d is about 10 nm-50 nm. The second Ti layer 36c may not be provided, and only the TiN layer 36d may be provided.

The n-side contact electrode 36 is formed inside the second region W2. The region in which the n-side contact electrode 36 is formed is defined as "fourth region W4". The n-side contact electrode 36 is formed to be in ohmic contact with the n-type semiconductor layer 24 over the entirety of the fourth region W4. By using a Ti/Al layer as the n-side contact electrode 36, contact resistance of $1\times10^{-2}$ $\Omega\cdot cm^2$ or smaller (e.g., $1\times10^{-3}$ $\Omega\cdot cm^2$ or smaller) can be realized. The n-side contact electrode 36 is formed to result in high reflectivity for deep ultraviolet light over the entirety of the fourth region W4. By configuring the first Ti layer 36a to have a small thickness, the reflectivity of the n-side contact electrode 36 of 80% or higher (e.g., about 85%-90%) for ultraviolet light having a wavelength of 280 nm can be obtained. In this specification, the reflectivity of the n-side contact electrode 36 for ultraviolet light having a wavelength of 280 nm incident from the side of the n-type semiconductor layer 24 is also referred to as "second reflectivity R2".

It is preferred that the n-side contact electrode 36 be formed evenly over the entirety of the fourth region W4. Stated otherwise, it is preferred that the layers 36a-36d forming the n-side contact electrode 36 be formed in a uniform thickness over the entirety of the fourth region W4. This allows the n-side contact electrode 36 to function as a highly efficient reflection electrode that reflects the ultraviolet light from the active layer 26 and guides it toward the second principal surface 20b of the substrate 20 and to function as a low-resistance contact electrode over the entirety of the fourth region W4. It is preferred that the n-side contact electrode 36 does not contain gold (Au), which could cause lower the ultraviolet reflectivity.

The protective layer 38 is provided to cover the side surface (also referred to as a mesa surface 12) of the active layer 26 and the p-type semiconductor layer 28 and the surfaces of the p-side contact electrode 34 and the n-side contact electrode 36. FIG. 1 shows that the mesa surface 12 of the active layer 26 and the p-type semiconductor layer 28 is perpendicular to the substrate 20. Alternatively, the mesa surface 12 may be sloped at a predetermined angle of slope with respect to the substrate 20. The angle of slope of the mesa surface 12 of the active layer 26 and the p-type semiconductor layer 28 is, for example, not less than 40° and less than 55°.

The protective layer 38 is made of a dielectric material such as silicon oxide ($SiO_2$), silicon oxynitride (SiON), or aluminum oxide ($Al_2O_3$). The thickness of the protective layer 38 is, for example, 100 nm or larger, 200 nm or larger, 300 nm or larger, or 500 nm or larger. The thickness of the protective layer 38 is, for example, 2 μm or smaller, 1 μm or smaller, or 800 nm or smaller. By configuring the protective layer 38 to have a large thickness, the surfaces of the respective layers formed on the n-type semiconductor layer 24 are suitably covered and protected.

The protective layer 38 is made of a material having a lower refractive index for deep ultraviolet light than the active layer 26. The refractive index of the AlGaN-based semiconductor material forming the active layer 26 depends on the composition ratio and is about 2.1-2.56. Meanwhile, the refractive index of $SiO_2$ that could form the protective layer 38 for ultraviolet light having a wavelength of 280 nm is about 1.4, the refractive index of SiON that could form the protective layer 38 for ultraviolet light having a wavelength of 280 nm is about 1.4-2.1, and the refractive index of $Al_2O_3$ that could form the protective layer 38 for ultraviolet light having a wavelength of 280 nm is about 1.8. By providing the protective layer 38 having a low refractive index, a larger portion of ultraviolet light can be totally reflected at the interface between the active layer 26 and the protective layer 38 and guided toward the second principal surface 20b of the substrate 20 that is the light extraction surface. In the case of $SiO_2$, in particular, the refractive index difference from the active layer 26 is larger so that the reflection characteristic is further improved.

The p-side pad electrode 44 and the n-side pad electrode 46 (generically referred to as pad electrodes) are portions bonded when the semiconductor light-emitting element 10 is mounted on a package substrate or the like. The p-side pad electrode 44 is provided on the p-side contact electrode 34 and is electrically connected to the p-side contact electrode 34 via a p-side opening 38p that extends through the protective layer 38. The n-side pad electrode 46 is provided on the n-side contact electrode 36 and is electrically connected to the n-side contact electrode 36 via an n-side opening 38n that extends through the protective layer 38.

From the perspective of providing resistance to corrosion, the pad electrodes 44, 46 are configured to contain Au. For example, the pad electrodes 44, 46 are comprised of a Ni/Au, Ti/Au, or Ti/Pt/Au stack structure. In the case the pad electrodes 44, 46 are bonded by gold-tin (AuSn), an AuSn layer embodying the metal joining member may be included in the pad electrodes 44, 46.

Figure 2:
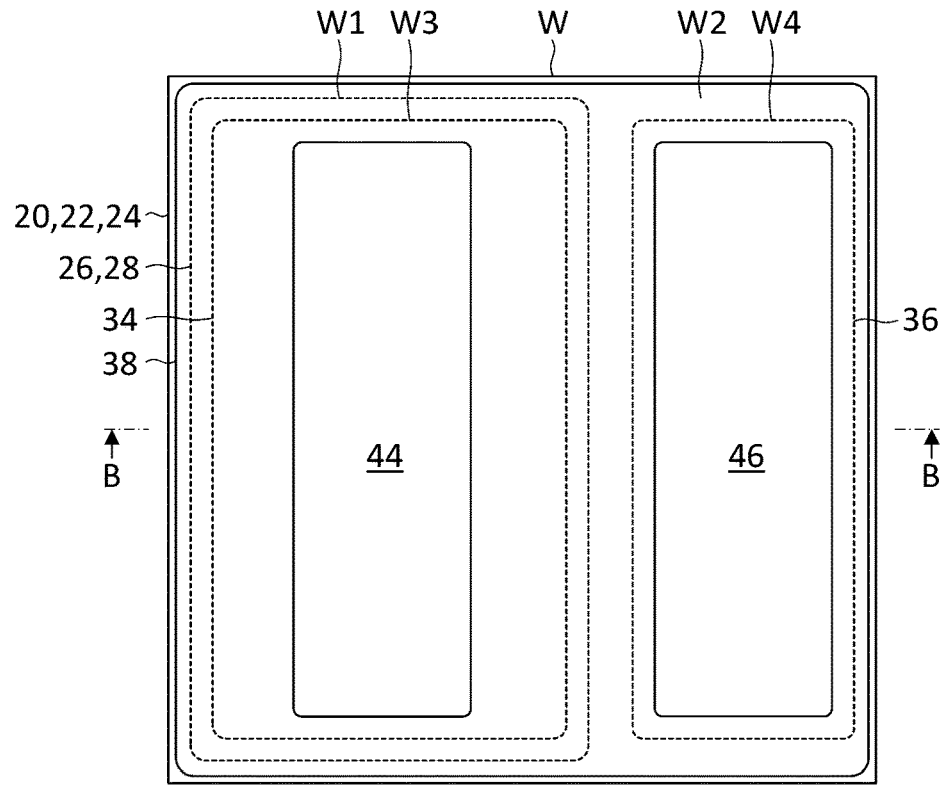
FIG. 2 is a top view schematically showing a configuration of the semiconductor light-emitting element according to an embodiment.

FIG. 2 is a top view schematically showing a configuration of the semiconductor light-emitting element 10 according to the embodiment. FIG. 1 described above corresponds to a B-B cross section of FIG. 2. The outer shape of the semiconductor light-emitting element 10 is defined by the outer circumference of the substrate 20 and is rectangular or square. An area S0 (also referred to as a total area) of a region W occupied by the semiconductor light-emitting element 10 in a plan view of FIG. 2 is equal to the area of the first principal surface 20a or the second principal surface 20b of the substrate 20. The first region W1 is a region in which the active layer 26 and the p-type semiconductor layer 28 are formed. The area of the first region W1 is about 55%-65% of the total area S0. The second region W2 is a region in which the active layer 26 or the p-type semiconductor layer 28 is not formed and is a region excluding the first region W1. The area of the second region W2 is about 35%-45% of the total area S0.

The third region W3 is a region in which the p-side contact electrode 34 is formed and is a region slightly smaller than the first region W1. The area (also referred to as the first area S1) of the third region W3 occupied by the p-side contact electrode 34 is about 45%-50% of the total area S0. The fourth region W4 occupied by the n-side contact electrode 36 is a region in which the n-side contact electrode 36 is formed and is a region smaller than the second region W2. The area (also referred to as the second area S2) of the fourth region W4 is about 25%-30% of the total area S0. Therefore, the first area S1 (45%-50%) occupied by the p-side contact electrode 34 is larger than the second area S2 (25%-30%) occupied by the n-side contact electrode 36 (i.e., S1>S2). For example, the first area S1 is configured to be 1.5 times the second area S2 or larger. Further, the area occupied by the p-side contact electrode 34 and the n-side contact electrode 36, i.e., a sum (S1+S2) of the first area S1 and the second area S2 is 70%-80% of the total area S0.

In the example shown in FIG. 2, the third region W3 in which the p-side contact electrode 34 is formed and the fourth region W4 in which the n-side contact electrode 36 is formed are substantially rectangular. The third region W3 and the fourth region W4 need not necessarily be formed in a substantially rectangular shape but may have an arbitrary shape. For example, the third region W3 and the fourth region W4 may be formed in a comb-tooth shape such that the comb teeth of the regions are inserted into each another.

According to this embodiment, the reflection efficiency of the p-side contact electrode 34 and the n-side contact electrode 36 as reflection electrodes can be 50% or higher with respect to the total area S0 of the semiconductor light-emitting element 10. In this specification, the reflection efficiency Rt of the element as a whole can be defined as $Rt=(S1/S0) \times R1+(S2/S0) \times R2$. As already described, the total area of the principal surface of the substrate 20 is denoted as S0, the area (the first area) on the p-type semiconductor layer 28 in which the p-side contact electrode 34 is formed as S1, the area (the second area) on the n-type semiconductor layer 24 in which the n-side contact electrode 36 is formed as S2, the reflectivity (the first reflectivity) of the p-side contact electrode 34 for ultraviolet having a wavelength of 280 nm incident from the side of the p-type semiconductor layer 28 as R1, and the reflectivity (the second reflectivity) of the n-side contact electrode 36 for ultraviolet light having a wavelength of 280 nm incident from the side of the n-type semiconductor layer 24 as R2.

In one embodiment, the p-side contact electrode 34 is comprised of an Rh layer having a thickness of 100 nm, and the n-side contact electrode 36 is comprised of a Ti/Al/Ti/TiN layer having a thickness of 2 nm/600 nm/25 nm/25 nm. In this embodiment, the first reflectivity R1 is about 63%, and the second reflectivity R2 is about 89%. Therefore, the first reflectivity R1 is equal to lower than the second reflectivity R2 (i.e., R1≤R2). In this embodiment, the first area S1 of 45% or larger and the second area S2 of 25% or larger cause the reflection efficiency Rt of the element as a whole to be 50% or higher. For example, the first area S1 of 47% and the second area S2 of 27% cause the reflection efficiency Rt of the element as a whole to be 54%.

Figure 3:
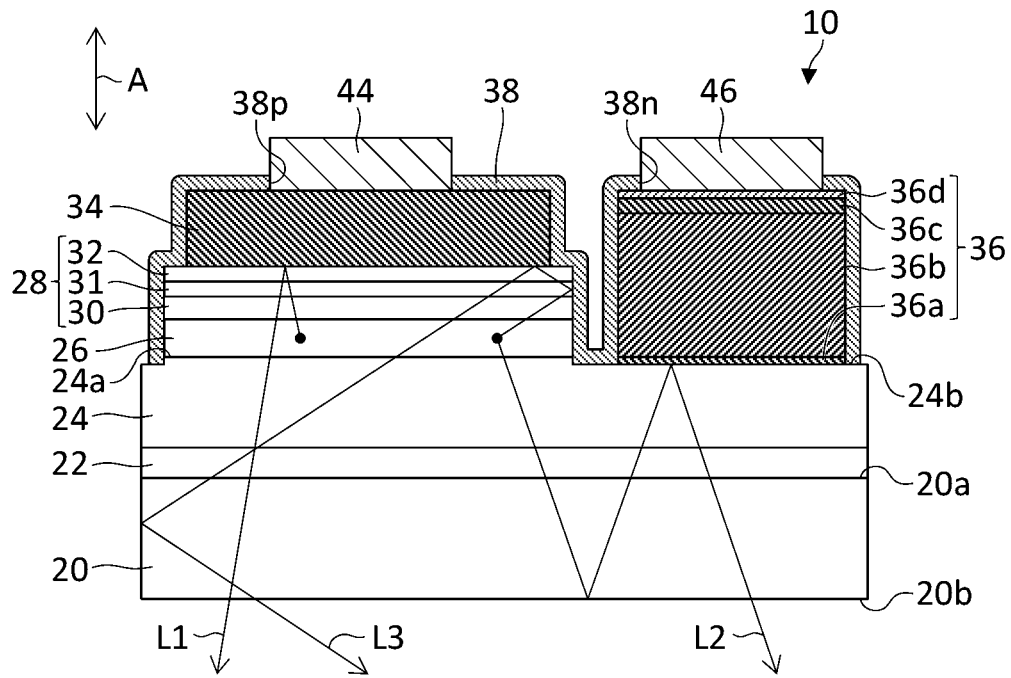
FIG. 3 schematically shows the function of the reflection electrodes.

FIG. 3 schematically shows the function of the reflection electrodes and illustrates ultraviolet light rays L1, L2, L3 emitted toward the second principal surface 20b of the substrate 20. The first light ray L1 represents the light reflected by the p-side contact electrode 34 before traveling toward the second principal surface 20b of the substrate 20. By configuring the first area S1 and the first reflectivity R1 of the p-side contact electrode 34 to be larger, the intensity of ultraviolet light like the first light ray L1 reflected by the p-side contact electrode 34 and then being output outside can be increased. The second light ray L2 represents the light reflected by the n-side contact electrode 36 before traveling toward the second principal surface 20b of the substrate 20. By configuring the second area S2 and the second reflectivity R2 of the n-side contact electrode 36 to be larger, the intensity of ultraviolet light like the second light ray L2 reflected by the n-side contact electrode 36 and then being output outside can be increased. The third light ray L3 represents the light reflected by the mesa surface 12 of the active layer 26 or the p-type semiconductor layer 28 before traveling toward the second principal surface 20b of the substrate 20. By providing the protective layer 38 having a lower refractive index, the proportion of ultraviolet light totally reflected by the mesa surface 12 can be increased, and the intensity of ultraviolet light like the third light ray L3 reflected by the mesa surface 12 and then being output outside can be increased.

Each of the light rays L1-L3 as illustrated shows a case in which the light is reflected only once by the p-side contact electrode 34, the n-side contact electrode 36, or the mesa surface 12. There is also ultraviolet light that is reflected multiple times inside the semiconductor light-emitting element 10 before being output outside. Further, there is also ultraviolet light reflected by both the p-side contact electrode 34 and the n-side contact electrode 36 before being output outside. According to this embodiment, the intensity of ultraviolet light output from the second principal surface 20b of the substrate 20 can be suitably increased by defining the reflection efficiency Rt of the element as a whole and configuring the semiconductor light-emitting element 10 such that the reflection efficiency Rt is 50% or higher. In this way, the light extraction efficiency of the semiconductor light-emitting element 10 can be increased according to this embodiment.

According to this embodiment, the area of the first region W1 in which the active layer 26 is provided can be enlarged by configuring the first area S1 occupied by the p-side contact electrode 34 to be larger than the second area S2 occupied by the n-side contact electrode 36. By increasing the proportion of the area of the first region W1 occupied by the active layer 26, the light emission efficiency per a unit area of the substrate 20 can be increased, and the light extraction efficiency of the semiconductor light-emitting element 10 can be increased.

According to this embodiment, the quantity of ultraviolet light absorbed by the p-type contact layer 32 can be reduced by reducing the thickness of the p-type contact layer 32. In other words, the quantity of absorption of ultraviolet light reciprocally transmitted through the p-type contact layer 32 and reflected by the p-side contact electrode 34 as indicated by the first light ray L1 can be reduced. In this way, the light extraction efficiency of the semiconductor light-emitting element 10 can be increased.

Figure 4:
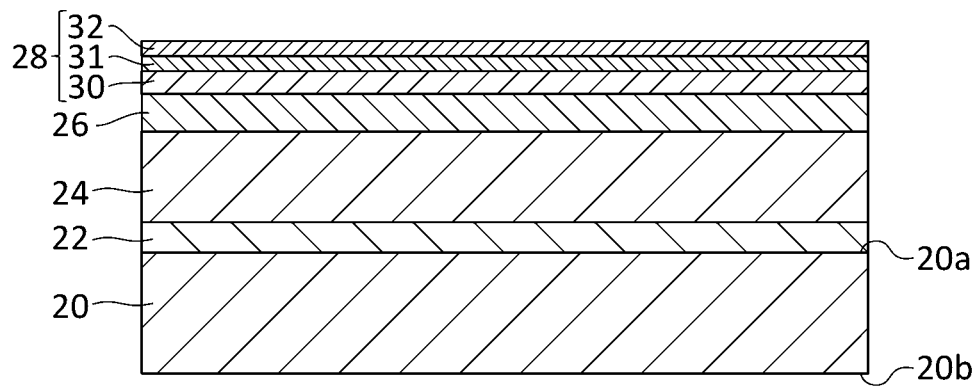
FIG. 4 schematically shows a step of manufacturing the semiconductor light-emitting element.

A description will now be given of a method of manufacturing the semiconductor light-emitting element 10. FIGS. 4-9 schematically show steps of manufacturing the semiconductor light-emitting element 10. Referring to FIG. 4, the base layer 22, the n-type semiconductor layer 24, the active layer 26, the p-type semiconductor layer 28 (the p-type first clad layer 30, the p-type second clad layer 31, and the p-type contact layer 32) are first formed on the first principal surface 20a of the substrate 20 successively.

The substrate 20 is a sapphire ($Al_2O_3$) substrate and is a growth substrate for forming an AlGaN-based semiconductor material. For example, the base layer 22 is formed on the (0001) plane of the sapphire substrate. The base layer 22 includes, for example, an AlN (HT-AlN) layer grown at a high temperature and an undoped AlGaN (u-AlGaN) layer. The n-type semiconductor layer 24, the active layer 26, and the p-type semiconductor layer 28 are layers made of an AlGaN-based semiconductor material, an AlN-based semiconductor material, or a GaN-based semiconductor material and can be formed by a well-known epitaxial growth method such as the metalorganic vapor phase epitaxy (MOVPE) method and the molecular beam epitaxial (MBE) method.

Figure 5:
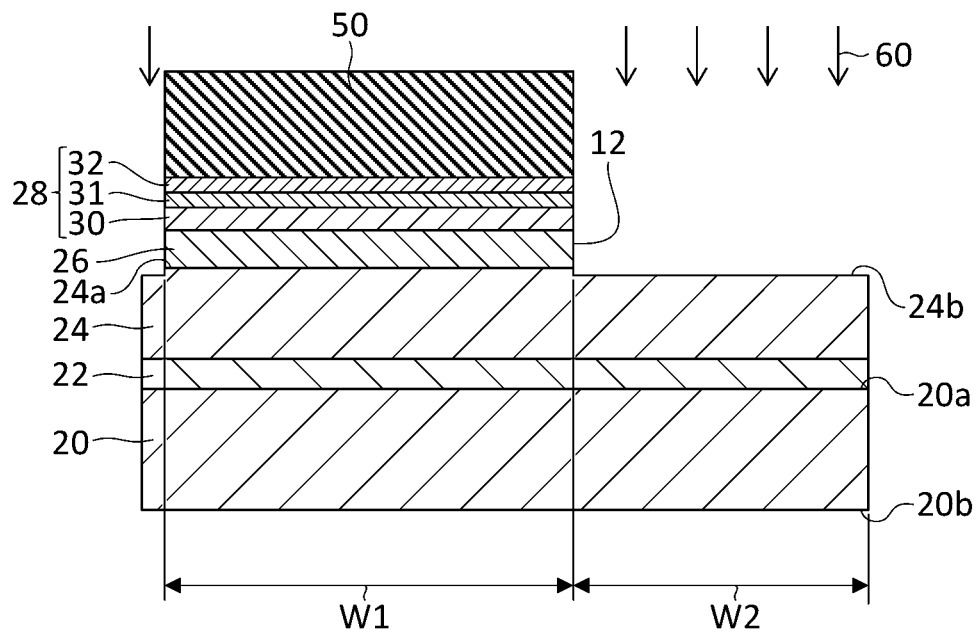
FIG. 5 schematically shows a step of manufacturing the semiconductor light-emitting element.

Subsequently, as shown in FIG. 5, a mask 50 is formed in the first region W1 on the p-type semiconductor layer 28, and the p-type semiconductor layer 28 and the active layer 26 are dry-etched 60 from above the mask 50. The mask 50 can be formed by using, for example, a well-known photolithographic technique. The dry-etching 60 is performed until the n-type semiconductor layer 24 is exposed in the second region W2. In this way, the second top surface 24b of the n-type semiconductor layer 24 is formed. The active layer 26 and the p-type semiconductor layer 28 having the mesa surface 12 are formed in the first region W1. For example, reactive ion etching using an etching gas turned into a plasma can be used in the step of forming the mesa surface 12. For example, inductively coupled plasma (ICP) etching may be used. The mask 50 is removed after the dry-etching 60 is performed.

Figure 6:
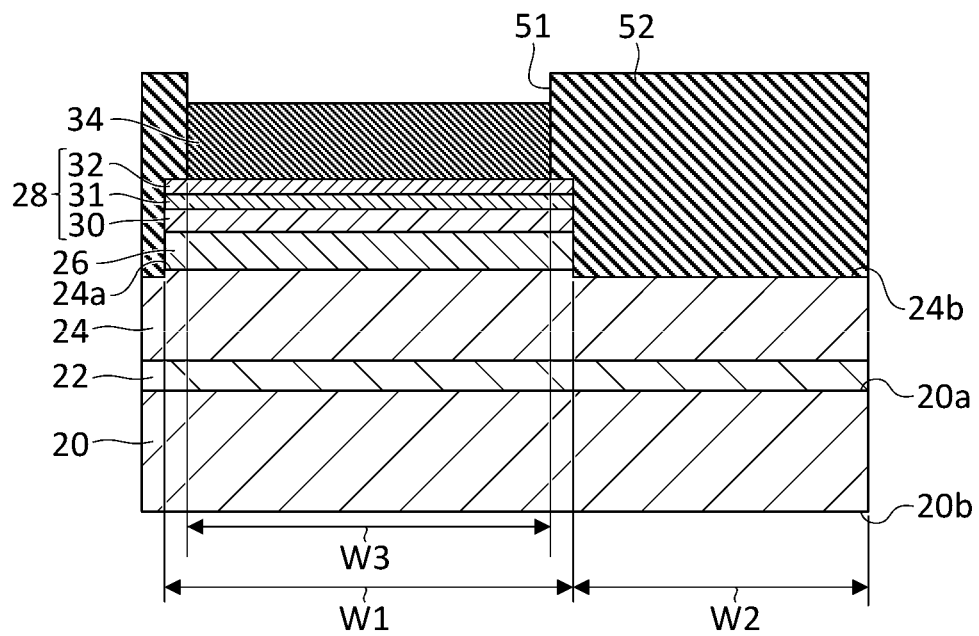
FIG. 6 schematically shows a step of manufacturing the semiconductor light-emitting element.

Subsequently, as shown in FIG. 6, a mask 52 having an opening 51 in the third region W3 is formed, and the p-side contact electrode 34 is formed in the third region W3 on the p-type semiconductor layer 28. The mask 52 can be formed by using, for example, a well-known photolithography technique. The p-side contact electrode 34 can be formed by sputtering or electron beam (EB) deposition. Proper ohmic contact can be established between the p-type semiconductor layer 28 and the p-side contact electrode 34 by forming the p-side contact electrode 34 on the p-type semiconductor layer 28 immediately after the mesa surface 12 is formed. The p-side contact electrode 34 is annealed after the p-side contact electrode 34 is formed and the mask 52 is removed.

Figure 7:
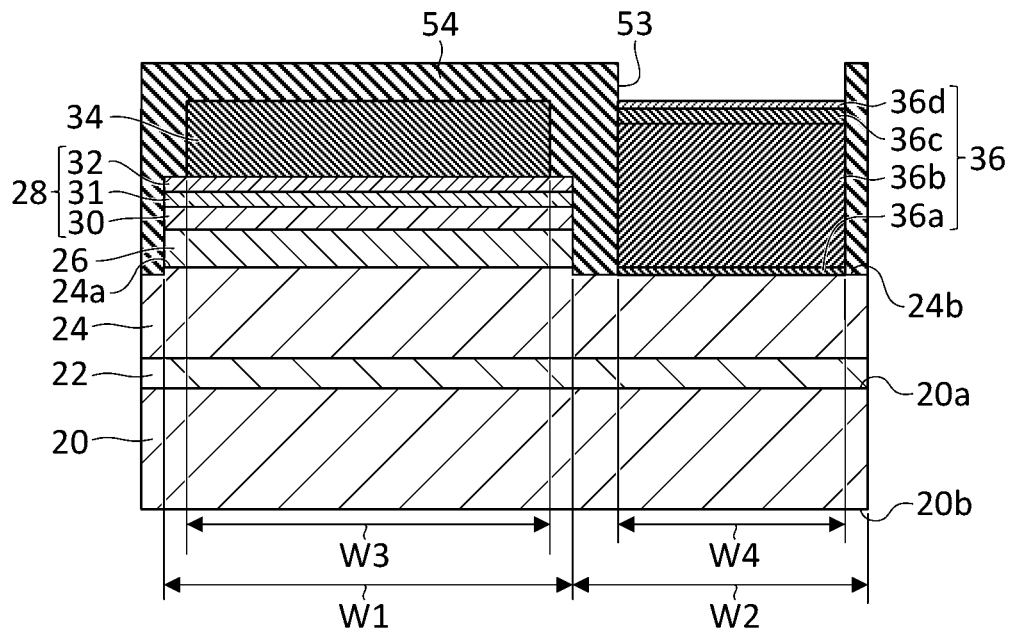
FIG. 7 schematically shows a step of manufacturing the semiconductor light-emitting element.

Subsequently, as shown in FIG. 7, a mask 54 having an opening 53 in the fourth region W4 is formed, and the n-side contact electrode 36 is formed in the fourth region W4 on the second top surface 24b of the n-type semiconductor layer 24. The mask 54 can be formed by using, for example, a well-known photolithography technique. First, the first Ti layer 36a, the Al layer 36b, and the second Ti layer 36c are formed on the second top surface 24b of the n-type semiconductor layer 24. These layers are formed by sputtering or EB deposition. By forming these layers by sputtering, metal layers having a smaller film density can be formed than by using EB deposition, and excellent contact resistance is realized at a relatively low annealing temperature.

The mask 54 is then removed. Nitrogen (N) atoms are supplied to the surface of the second Ti layer 36c to nitride the surface of the second Ti layer 36c, by processing the surface of the second Ti layer 36c with an ammonia ($NH_3$) gas plasma. In this way, the TiN layer 36d is formed. The temperature of the plasma process for forming the TiN layer 36d is preferably below the melting point of Al (about 660° C.), and, more preferably, below 300° C., for example.

The n-side contact electrode 36 is then annealed. The n-side contact electrode 36 is preferably annealed at a temperature below the melting point of Al (about 660° C.) and is preferably annealed at a temperature not lower than 560° C. and not higher than 650° C. The film density of the Al layer of less than 2.7 g/cm$^3$ and the annealing temperature of not lower than 560° C. and not higher than 650° C. ensure that the contact resistance of the n-side contact electrode 36 is $1\times10^{-2}$ $\Omega\cdot cm^2$ or smaller. The annealing temperature of not lower than 560° C. and not higher than 650° C. enhances the flatness of the n-side contact electrode 36 after annealing and provides an ultraviolet reflectivity of 80% or higher.

Figure 8:
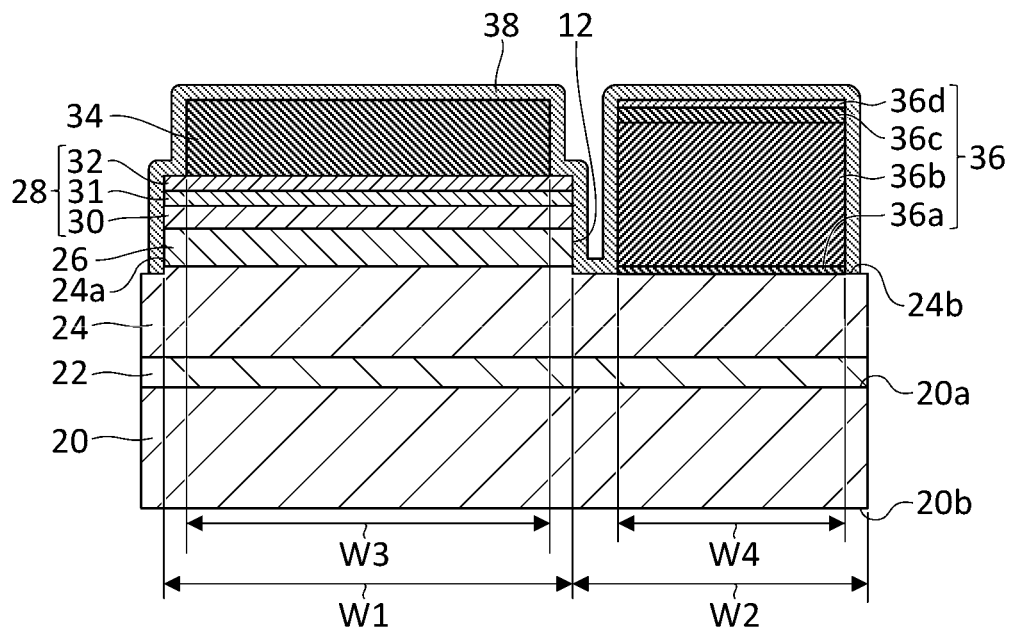
FIG. 8 schematically shows a step of manufacturing the semiconductor light-emitting element.

Subsequently, the protective layer 38 is formed as shown in FIG. 8. The protective layer 38 is formed to cover the entirety of the top surface of the element structure. The protective layer 38 is formed to cover the surface of the p-side contact electrode 34 and the n-side contact electrode 36 and to cover the exposed surfaces of the active layer 26 and the p-type semiconductor layer 28 including the mesa surface 12. The protective layer 38 is provided to cover at least a part of the second top surface 24b of the n-type semiconductor layer 24.

Figure 9:
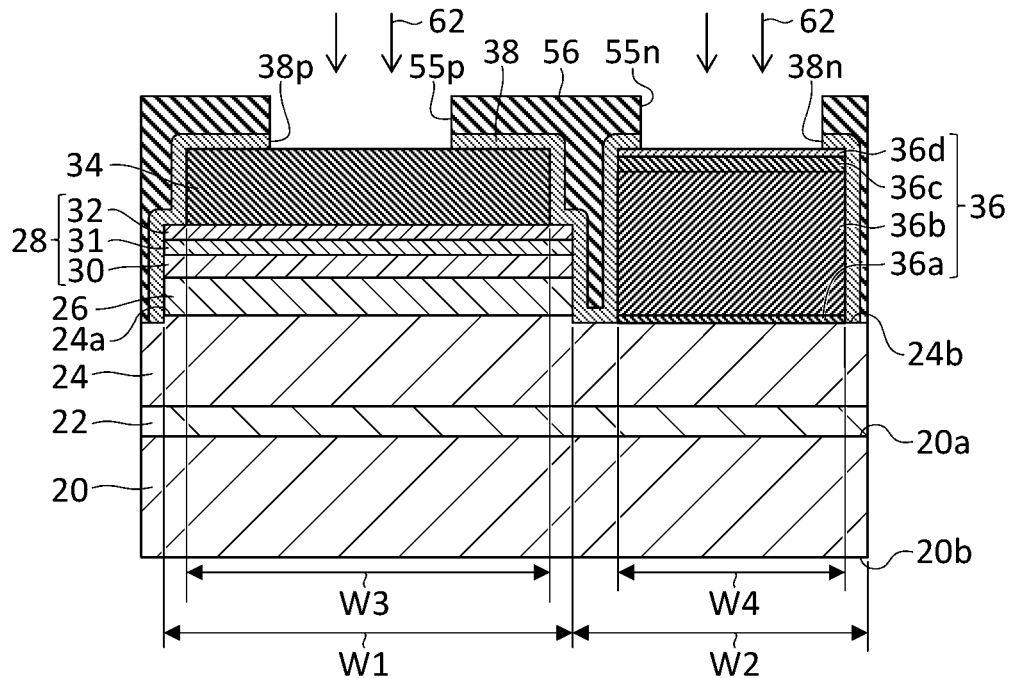
FIG. 9 schematically shows a step of manufacturing the semiconductor light-emitting element.

Subsequently, as shown in FIG. 9, a mask 56 having openings 55p, 55n is formed, and the p-side opening 38p and the n-side opening 38n are formed by removing portions of the protective layer 38. The mask 56 can be formed by using, for example, a well-known photolithography technique. The openings 55p, 55n of the mask 56 are positioned above the p-side contact electrode 34 and the n-side contact electrode 36, respectively. Portions of the protective layer 38 can be removed by dry-etching 62 using a CF-based etching gas such as a hexafluoroethane ($C_2F_6$) gas. In this dry-etching step, the Rh layer of the p-side contact electrode 34 and the TiN layer 36d of the n-side contact electrode 36 function as stop layers for the dry-etching 62. This prevents a damage to the p-side contact electrode 34 and the n-side contact electrode 36 and maintains the low-resistance and high-reflectivity contact electrodes.

Subsequently, the p-side pad electrode 44 is formed in the p-side opening 38p on the p-side contact electrode 34, and the n-side pad electrode 46 is formed in the n-side opening 38n on the n-side contact electrode 36. For example, the pad electrodes 44, 46 can be formed by first depositing the Ni layer or the Ti layer and then depositing the Au layer thereon. A further metal layer may be provided on the Au layer. For example, an Sn layer, an AuSn layer, or a stack structure of Sn/Au layers may be formed. The pad electrodes 44, 46 may be formed by using the mask 56 or formed by using further resist mask different from the mask 56. After the pad electrodes 44, 46 are formed, the mask 56 or the further resist mask is removed.

Through the steps described above, the semiconductor light-emitting element 10 shown in FIG. 1 is completed. According to this embodiment, the p-side contact electrode 34 comprised of the Rh layer can be placed in suitable ohmic contact with the p-type contact layer 32, and contact resistance of $1\times10^{-2}$ $\Omega\cdot cm^2$ or smaller can be realized, by forming the p-side contact electrode 34 before forming and annealing the n-side contact electrode 36.

Figure 10:
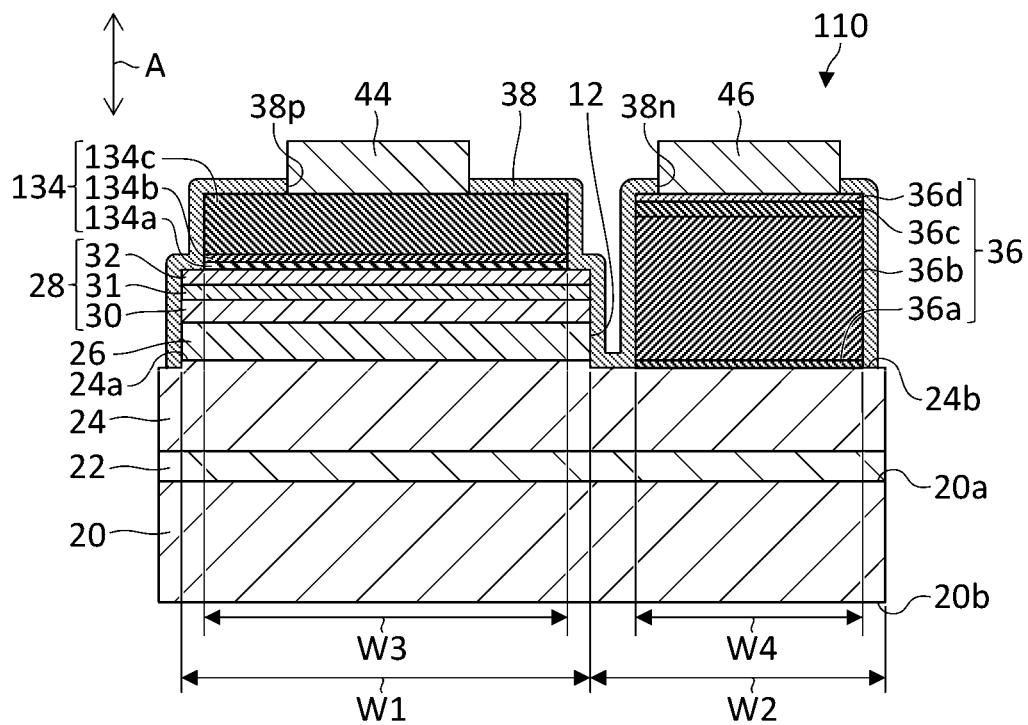
FIG. 10 is a cross-sectional view schematically showing a configuration of a semiconductor light-emitting element according to another embodiment.

FIG. 10 is a cross-sectional view schematically showing a configuration of a semiconductor light-emitting element 110 according to another embodiment. This embodiment differs from the embodiment described above in that a p-side contact electrode 134 is configured as a three-layer structure. A description will now be given of the semiconductor light-emitting element 110, highlighting the difference from the embodiment described above.

The semiconductor light-emitting element 110 includes the substrate 20, the base layer 22, the n-type semiconductor layer 24, the active layer 26, the p-type semiconductor layer 28, a p-side contact electrode 134, the n-side contact electrode 36, the protective layer 38, the p-side pad electrode 44, and the n-side pad electrode 46.

The p-side contact electrode 134 includes a transparent conductive oxide (TCO) layer 134a and metal layers 134b, 134c provided on the TCO layer 134a. The term "transparent conductive oxide" refers to a material generally called a transparent conductive oxide and refers to a material that is transparent (highly transmissive) to visible light. Therefore, a "transparent conductive oxide" is not necessarily transparent to the deep ultraviolet light emitted by the active layer 26. For example, the transparent conductive oxide can absorb ultraviolet light having a wavelength of 280 nm to a certain degree. It is preferred that the TCO layer 134a be made of tin oxide ($SnO_2$), zinc oxide (ZnO), indium tin oxide (ITO) or the like. The TCO layer 134a is preferably highly conductive ITO layer. It is preferred to form the TCO layer 134a to be thin to reduce the quantity of absorption of the deep ultraviolet light emitted by the active layer 26. It is preferred that the TCO layer 134a be, for example, an ITO layer having a thickness of 4 nm or smaller and be an ITO layer having a thickness of about 3 nm.

The metal layers 134b, 134c are formed to have a high reflectivity for ultraviolet light. The first metal layer 134b is a palladium (Pd) layer or an Ni layer, and the second metal layer 134c is an Al layer. The thickness of the second metal layer 134c is about 100 nm-1000 nm and is preferably 200 nm or larger. By configuring the Al layer to have a large thickness, the ultraviolet reflectivity of the p-side contact electrode 134 can be increased. The first metal layer 134b is provided to increase the adhesiveness between the TCO layer 134a and the second metal layer 134c. It is preferred to form the first metal layer 134b to be thin to reduce the quantity of absorption of ultraviolet light. The first metal layer 134b is formed to have a thickness of 5 nm or smaller, 3 nm or smaller, or 2 nm or smaller.

According to this embodiment, the contact resistance of the p-side contact electrode 134 can be $1 \times 10^{-2}$ $\Omega \cdot cm^2$ or smaller by using the TCO layer 134a placed in ohmic contact with the p-type contact layer 32. Further, by combining the Pd layer having a small thickness and the Al layer having a large thickness, the adhesiveness of the Al layer with the TCO layer 134a is increased, and the reflectivity of the metal layers 134b, 134c for the ultraviolet light having a wavelength of 280 nm can be 90% or higher.

In this embodiment, the TCO layer 134a is inserted between the p-type semiconductor layer 28 and the metal layers 134b, 134c. Therefore, loss is incurred as a result of the light being reciprocally transmitted through the TCO layer 134a. It is therefore necessary to consider the loss incurred as a result of the light being reciprocally transmitted through the TCO layer 134a to determine the first reflectivity R1 of the p-side contact electrode 134 for the ultraviolet light incident from the side of the p-type semiconductor layer 28. Denoting the reflectivity of the metal layers 134b, 134c as R, and the one-way transmissivity of the TCO layer 134a as T, the first reflectivity R1 of the p-side contact electrode 134 as a whole will be such that $R1=RT^2$. When the TCO layer 134a is made of ITO, for example, the transmissivity of an ITO layer having a thickness of 3 nm for ultraviolet light having a wavelength of 280 nm is about 87%, and the transmissivity of an ITO layer having a thickness of 4 nm for ultraviolet light having a wavelength of 280 nm is about 83%. Given that the reflectivity of the metal layers 134b, 134c for ultraviolet light having a wavelength of 280 nm is 90%, the first reflectivity R1 of the p-side contact electrode 134 occurring when the ITO layer having a thickness of 4 nm is used will be about 68%, and the first reflectivity R1 of the p-side contact electrode 134 occurring when the ITO layer having a thickness of 4 nm is used will be about 62%.

Therefore, it is possible to ensure that $(S1+S2)/S0 \geq 0.7$, $R1 \geq 0.6$, and $R2 \geq 0.8$ in this embodiment as similar in the foregoing embodiment. This ensures that the conditions requiring $(S1/S0) \times R1+(S2/S0) \times R2 \geq 0.5$, $S1>S2$, and $R1 \leq R2$ are met, and the reflection efficiency Rt of the element as a whole is 50% or higher. As a result, the semiconductor light-emitting element 110 having an excellent light extraction efficiency can be provided.

In one embodiment, the p-side contact electrode 34 is comprised of an ITO/Pd/Al layer having a thickness of 3 nm/2 nm/200 nm, and the n-side contact electrode 36 is comprised of a Ti/Al/Ti/TiN layer having a thickness of 2 nm/600 nm/25 nm/25 nm. In this embodiment, the first reflectivity R1 is 68%, and the second reflectivity R2 is 89%. By configuring the first area S1 to be 45% or larger and the second area S2 to be 25% or larger in this embodiment, the reflection efficiency Rt of the element as a whole will be 50% or higher. Given that, for example, the first area S1 is 47% and the second area S2 is 27%, the reflection efficiency Rt of the element as a whole will be 56%.

The semiconductor light-emitting element 110 can be manufactured by steps similar to those of the semiconductor light-emitting element 10 according to the embodiment described above. The TCO layer 134a, the first metal layer 134b, and the second metal layer 134c forming the p-side contact electrode 134 can be formed by sputtering or electron beam (EB) deposition. In this embodiment, the p-side contact electrode 134 may be formed before forming the n-side contact electrode 36, or the p-side contact electrode 134 may be formed after forming the n-side contact electrode 36.

Described above is an explanation based on an exemplary embodiment. The embodiment is intended to be illustrative only and it will be understood by those skilled in the art that various design changes are possible and various modifications are possible and that such modifications are also within the scope of the present invention.

What is claimed is:
1. A semiconductor light-emitting element comprising:
a n-type semiconductor layer made of an n-type AlGaN-based semiconductor material provided on a principal surface of a substrate;
an active layer made of an AlGaN-based semiconductor material provided on the n-type semiconductor layer and configured to emit ultraviolet light having a wavelength of 320 nm or shorter;
a p-type semiconductor layer provided on the active layer;
a p-side contact electrode provided on the p-type semiconductor layer; and an n-side contact electrode provided in a region on the n-type semiconductor layer different from a region in which the active layer is formed, wherein the n-side contact electrode includes a Ti layer in contact with the n-type semiconductor layer and having a thickness of 2 nm or smaller and an Al layer provided on the Ti layer and having a thickness of 100 nm or larger, and wherein denoting a total area of the principal surface of the substrate as S0, an area on the p-type semiconductor layer in which the p-side contact electrode is formed as S1, an area on the n-type semiconductor layer in which the n-side contact electrode is formed as S2, a reflectivity of the p-side contact electrode for ultraviolet having a wavelength of 280 nm incident from a side of the p-type semiconductor layer as R1, and a reflectivity of the n-side contact electrode for ultraviolet light having a wavelength of 280 nm incident from a side of the n-type semiconductor layer as R2, $(S1/S0) \times R1 + (S2/S0) \times R2 \geq 0.5$, $S1 > S2$, and $R1 \leq R2$.

2. The semiconductor light-emitting element according to claim 1, wherein the p-side contact electrode includes an Rh layer in contact with the p-type semiconductor layer.

3. The semiconductor light-emitting element according to claim 1, wherein the p-side contact electrode includes a transparent conductive oxide layer in contact with the p-type semiconductor layer and a metal layer provided on the transparent conductive oxide layer, and wherein denoting a transmissivity of the transparent conductive oxide layer for ultraviolet having a wavelength of 280 nm incident from a side of the p-type semiconductor layer as T, a reflectivity of the metal layer for ultraviolet having a wavelength of 280 nm incident from a side of the transparent conductive oxide layer as R, the reflectivity R1 of the p-side contact electrode is such that $R1 = RT^2$.

4. The semiconductor light-emitting element according to claim 3, wherein the transparent conductive oxide layer is an indium tin oxide layer having a thickness of 4 nm or smaller, and the metal layer includes an Al layer having a thickness of 100 nm or larger.

5. The semiconductor light-emitting element according to claim 1, wherein $(S1+S2)/S0 \geq 0.7$, $R1 \geq 0.6$, and $R2 \geq 0.8$.

6. The semiconductor light-emitting element according to claim 1, wherein the p-type semiconductor layer includes a p-type contact layer in contact with the p-side contact electrode, and the p-type contact layer is a p-type AlGaN or p-type GaN layer having an AlN ratio of 20% or lower, and wherein a contact resistance between the p-type contact layer and the p-side contact electrode is $1 \times 10^{-2} \Omega \cdot cm^2$ or smaller.

7. The semiconductor light-emitting element according to claim 6, wherein a thickness of the p-type contact layer is 20 nm or smaller.

8. The semiconductor light-emitting element according to claim 1, wherein the Ti layer is directly in contact with the Al layer in the n-side contact electrode.

* * * * *